United States Patent
Jekauc

(10) Patent No.: US 7,381,576 B2
(45) Date of Patent: Jun. 3, 2008

(54) METHOD AND APPARATUS FOR MONITORING PRECISION OF WATER PLACEMENT ALIGNMENT

(75) Inventor: Igor Jekauc, Richmond, VA (US)

(73) Assignee: Infineon Technologies Richmond, LP., Sandston, VA (US)

( * ) Notice: Subject to any disclaimer, the term of this patent is extended or adjusted under 35 U.S.C. 154(b) by 231 days.

(21) Appl. No.: 11/204,604

(22) Filed: Aug. 15, 2005

(65) Prior Publication Data

US 2007/0037301 A1   Feb. 15, 2007

(51) Int. Cl.
*H01L 21/66* (2006.01)

(52) U.S. Cl. ......... 438/14; 257/E21.525; 257/E21.529; 257/E21.53

(58) Field of Classification Search ............... 438/14
See application file for complete search history.

(56) References Cited

U.S. PATENT DOCUMENTS

| | | | |
|---|---|---|---|
| 5,194,743 A | 3/1993 | Aoyama et al. | 250/548 |
| 5,664,987 A * | 9/1997 | Renteln | 451/21 |
| 6,389,366 B1 | 5/2002 | Heavlin | 702/84 |
| 6,629,053 B1 | 9/2003 | Mooring | 702/94 |
| 6,893,974 B1 * | 5/2005 | Sedigh et al. | 438/714 |
| 7,214,552 B2 | 5/2007 | Devany et al. | 438/14 |
| 2003/0049376 A1 * | 3/2003 | Schwarm et al. | 427/255.28 |
| 2004/0198180 A1 * | 10/2004 | Toprac | 451/5 |
| 2005/0006556 A1 * | 1/2005 | Floyd et al. | 248/566 |

* cited by examiner

*Primary Examiner*—Trung Dang
(74) *Attorney, Agent, or Firm*—Brinks Hofer Gilson & Lione

(57) ABSTRACT

A method for monitoring precision of placement of semiconductor wafers in a semiconductor processing apparatus includes measuring thickness of an insulating film on a surface of a semiconductor substrate before etching a portion of the insulating film from the surface of the semiconductor substrate. The method further includes re-measuring the thickness of the insulating film to determine etch rates for the film at selected locations on the surface of the semiconductor wafer, and based on the determined etch rates, determining misalignment of the semiconductor wafer.

13 Claims, 6 Drawing Sheets

METHOD AND APPARATUS FOR MONITORING PRECISION OF WAFER PLACEMENT ALIGNMENT

BACKGROUND

The present application relates generally to semiconductor device processing and equipment. More particularly, the present invention relates to a method and apparatus for monitoring the precision of wafer placement alignment when processing semiconductor devices.

Processes to define electronic devices and interconnect on and near the surface of semiconductor substrates or wafers are well known. Such processes including patterning the surface using photoresist and possibly with a hardmask material such as polysilicon or silicon dioxide, etching materials formed by photolithography using wet or reactive ion chemistry, ion implantation to define devices, chemical-mechanical polishing for planarization, and film deposition and patterning for interconnect. These processes are generally well understood and are under constant refinement to improve yield. Yield is the percentage of good semiconductor chips produced from a substrate. Good semiconductor chips are those which pass all electrical, operational and other tests and may be sold as products to customers. Yield is an important parameter of manufacturing quality. These and other processes are always being refined to allow definition of ever smaller geometries.

Two methods for achieving smaller geometries are by defining more vertically oriented devices and by improving the electrical isolation between devices. Both these methods can be employed by etching deep trenches in the surface of the semiconductor substrate. The trenches define silicon islands where devices such as transistors may be formed. In subsequent process steps, the trenches can be filled with different materials to achieve desirable effects.

For example, a trench filled with insulating material such as silicon dioxide or silicon nitride will electrically isolate adjacent silicon islands, reducing the electrical interaction of devices built therein. The deep trench can be narrower in cross section than conventional junction isolation, in which a reverse-biased diode is formed to electrically isolate adjacent areas. With the use of narrow trenches, therefore, more of the surface area of the silicon die can be used for active devices, or the total area of the die is reducing. Thus, by using the vertically-etched trench, smaller geometries are obtained.

As another example, a trench filled with a conducting layer such as polysilicon which is separated in the trench with a thin insulating dialectric can form a charge storage capacitor for a dynamic random access memory (DRAM). The plates of the capacitor are thus oriented vertically, or perpendicular to the plane of the silicon surface. This is compared to conventional metal-oxide-semiconductor capacitors formed by defining a polysilicon plate on the wafer surface and separated from the silicon substrate by a very thin layer of gate oxide. By using the vertical capacitor, smaller horizontal geometries result for the capacitor and many more capacitors, and therefore DRAM storage cells, may be built on a single semiconductor die.

Deep trenches may be formed in a silicon wafer using a deep trench silicon etch tool. One conventional method of forming deep trenches on semiconductor surfaces is by plasma etching. Plasma etching occurs in an evacuated chamber in which a wafer is placed on an electrostatic chuck (ESC) which forms the cathode of a parallel plate plasma reactor. The ESC is cooled internally by liquid cooling systems to manage the temperature of the wafer. Due to slow response time of a liquid cooling system, temperature control is frequently supplemented with a controlled cooling gas pressure on the backside of the wafer for a faster and more precise temperature control. Heat is thus carried away from the back side of the wafer through the chuck while the front side is being etched. Gases are introduced to the chamber to provide a source of ions for the etching process. Radio frequency energy is applied to drive the generation of ions and thus the formation of plasma and the etching process. A focus ring may be added to focus or concentrate the reactive ions. A computer based recipe controls the operation according to a program of instructions which reflects the required times, temperatures and other processing conditions required for etching particular films. The process may be even further automated by adding a robot which places wafers in the chamber from a previous process or storage location and removes the wafers after etching for a subsequent process step. A well designed etching process will commonly produce very high yields across the entire wafer surface.

In semiconductor processes, while reduction in yield loss is always one goal of process improvement, small levels of yield loss have been tolerated as normal. For example, yield loss is expected at the edge of the wafer, where dice are formed in the yieldable edge exclusion zone. Because of non-uniform processing conditions at the wafer edge and for other reasons, dice near the edge fail more frequently and the yield can be reduced compared to other regions of the wafer. As long as the yield loss is within acceptable tolerance, the use of the processing equipment continues. A large yield loss which is out of tolerance is not tolerated and processing equipment will be taken off line while a yield problem is isolated and corrected. In the case of intermediate yield losses, attempts at resolution are made by various unscheduled maintenance procedures. For example, in a plasma etching process, adjustments to back side cooling pressures or process gases can temporarily improve the problem.

As more aggressive process technology has extended the yieldable edge exclusion zone to less than 2 mm from wafer edge, process control on the extreme edge of the wafer has gained critical importance. For deep trench (DT) technology, control of a DT silicon etch tool is one of the most critical parameters required to achieve good edge yields. DT etch hardware limitations in particular configurations are such that the process is most aggressive on the extreme edge of the wafer. Given that DT etch has the highest aspect ratio (meaning the ratio of the depth of the trench to its cross-section width), and that both the duration and etched depth of the process are more than twice of all other DRAM etches combined, even a 1-2% difference in across wafer performance is enough to cause significant yield loss. The systematic yield loss on the edge of the wafer is further influenced by wafer placement inside the chamber when the process characteristics are such that a systematic relationship exists between process parameters such as etch rate and wafer radius.

Accordingly, there is a need for an improved method for reducing process yield loss in semiconductor processing.

BRIEF SUMMARY

By way of introduction only, the presently disclosed embodiments improve the accuracy of wafer placement in a semiconductor processing chamber.

A method for monitoring precision of placement of semiconductor wafers in a semiconductor processing apparatus includes measuring thickness of a masking film on a surface of a semiconductor substrate before etching a portion of the hard mask from the surface of the semiconductor substrate. The method further includes re-measuring the thickness of the insulating film to determine etch rates for the film at selected locations on the surface of the semiconductor wafer, and based on the determined etch rates, determining misalignment of the semiconductor wafer.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

U.S. patent application Ser. No. 10/992,982, filed Nov. 19, 2004, discloses a method for eliminating systematic process yield loss via precision wafer placement alignment. This application is incorporated herein in its entirety by this reference. In this application, a method for a semiconductor process includes correlating yield loss for the performance of a processing step in a semiconductor manufacturing process with the mechanical placement of the semiconductor substrate and, based on the correlation, placing semiconductor substrates in a position with sufficient placement precision to reduce yield loss below a predetermined threshold.

Prior to the innovation of the incorporated application, methods of wafer placement calibration did not allow for the improvement of wafer placement accuracy needed to insure wafer yield improvement. Wafer alignments in the development chamber were previously performed by visual placement of the wafer in a chamber under vacuum. The wafer was required to be aligned without optical enhancement to tolerances of ±0.15 mm with a 3 lobed alignment jig. With this method, the accuracy cannot be improved beyond ±0.15 mm reliably and the wafer is often mistakenly aligned outside the jig boundaries. A wafer slightly outside the perimeter of the jig may fall into the alignment pocket making the appearance that the handoff is acceptable. Other methods of alignment involve the use of jigs whereby a pin is dropped through a hole, aligning it with a hole in the robot arm. Tolerances are limited with this method, and over time increase in error due to mechanical wear.

To improve the ability to align the wafer in the required tolerances, a microscope was selected as an optical enhancement device to provide consistent wafer alignment within the alignment jig. Also, a 200.3 mm, three lobe alignment jig was also replaced with a 200.2 mm, 4 lobe alignment jig. The four lobes were found to provide better alignment resolution by increasing the reference points to match the degrees of freedom of the robot movement—positive and negative reach direction and positive and negative theta rotation. The objective was to adjust the wafer so that there is equal spacing between the wafer edge and the alignment jig at each of the lobes.

Figure 1:
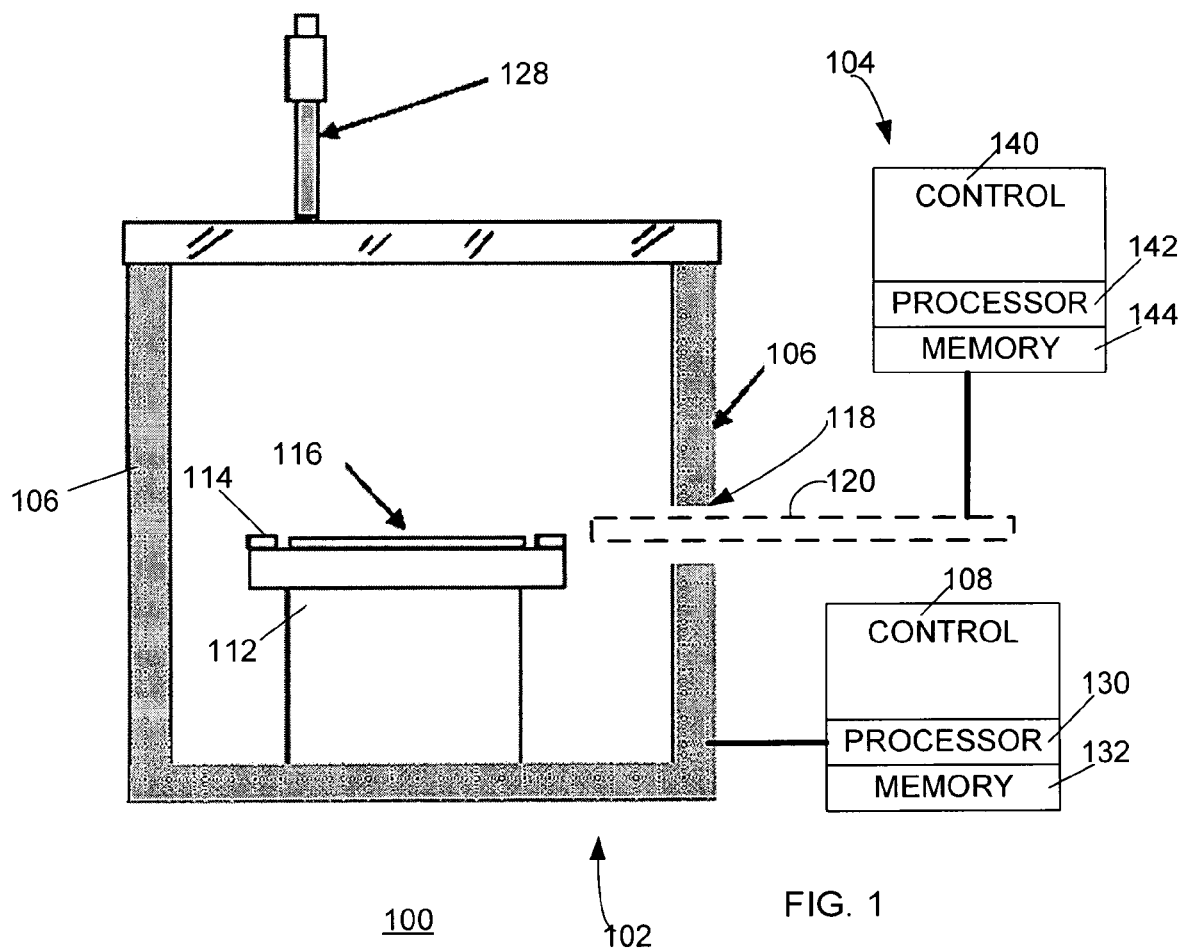
FIG. 1 is a view of a plasma etcher.

Referring now to the drawing, FIG. 1 shows an arrangement for processing semiconductor wafers 100. The arrangement 100 includes a semiconductor processing tool 102 and a robot 104. In the specific example of FIG. 1, the semiconductor processing tool is a plasma etcher 102. However, the methods described herein can be extended to any suitable semiconductor processing tool used for processing semiconductor wafers to produce a functioning integrated circuit.

The plasma etcher 102 includes a process chamber 106 and a controller 108. The process chamber 106 includes walls and a lid which define a plasma etching space. The plasma etcher 102 also includes equipment such as fluid control equipment for evacuating and filling gases in the process chamber 106, a radio frequency (RF) energy source for the plasma process, a focus ring or other kit parts for focusing RF energy in the process chamber 106, and thermal processing equipment for cooling the process chamber 106 and its contents. Some of these components are not shown so as to not unduly complicate the drawing figure.

The controller 108 includes one or more processors 130 and a memory 132. The memory 132 stores data and instructions for controlling the plasma etching process in the process chamber. In one embodiment, the plasma etcher 102 is a plasma etching system manufactured and sold by Tokyo Electron, Ltd., Tokyo Japan. Other similar equipment may be substituted and other types of semiconductor processing equipment may benefit from the methods and apparatus disclosed herein.

Contained within the process chamber 106 is an electrostatic chuck (ESC) 112. Arranged on the ESC 112 is an alignment jig 114 and a semiconductor substrate or wafer 116. The semiconductor wafer 116 is placed in the process chamber 106 for processing. In the specific example of a plasma etcher, a material such as silicon, silicon dioxide, silicon nitride or other insulating or conducting material is etched from the surface of the wafer or the substrate itself 116.

The ESC 112 may be made of any suitable material. However, because plasma etching is a high-temperature process, and because thermal uniformity across the wafer 116 is important to consistent etching of the film on the wafer surface, the ESC 112 may be made of thermally conductive material such as aluminum or aluminum nitride. The ESC 112 is also cooled, for example, by flowing a liquid coolant within the ESC 112 to convey heat from the back side of the wafer 116 to manage thermal environment of the wafer 116. The liquid cooling system can and often is complemented by a high-pressure backside cooling gas such as Helium applied to the backside of the wafer 116.

The ESC 112 is employed to retain the wafer 116 during the plasma etching process. The wafer 116 is placed with its back side in mechanical contact with the ESC 112. While the methods and apparatus disclosed herein are useful in a wide variety of semiconductor processing applications, the preferred embodiment of the drawing is a plasma etching process. In plasma etching, after formation of a film on the front side of the wafer 116 such as silicon dioxide, a pattern is formed using conventional photolithographic processes. The wafer is then placed in the process chamber 110 and a plasma gas is introduced to the chamber 110. Upon suitable application of RF energy, the plasma ions are propelled to the surface of the wafer 116 and remove exposed portions of the surface film.

During a single etch process, multiple films may be etched at the same time on the same tool using different process conditions for each film or the multiple stack may be etched in separate processes on different tools using different process conditions and possibly different etch hardware. In either configuration, the etched material from the previous step represents the masking material for the next etch step.

As an example in case of DT, a multiple stack includes silicon, nitride, oxide and polysilicon arranged in a stack. Polysilicon material is etched first. Polysilicon then provides the mask for the subsequent oxide and nitride etches. DT silicon etch then uses the oxide as the hard mask to etch silicon into the substrate. The four etch steps are done on three different tools with only the oxide and nitride etches being performed at the same time on the same tool.

Upon completion of the process, the wafer 116 is removed from the chamber 110. A measurement device 128 positioned near the chamber may be used to measure parameters inside the chamber during processing including plasma characteristics, surface film characteristics or to optically determine wafer misalignment during maintenance activities. These measurements can be done at the final etch step or during any of the intermediary etches.

The robot 104 includes a controller 140 having a processor 142, a memory 144 and a robot arm 120. The processor 142 operates in response to instructions and data stored in the memory 144. The robot 104 also includes motors and a control system for precisely positioning the robot arm 120.

For positioning the wafer 116 in the process chamber 106 and removing the wafer 116 from the chamber 106, the wall of the chamber 106 defines an opening 118. The robot arm 120 is extendable through the opening 118 to engage the wafer 116. Exemplary robot systems are manufactured by Yaskawa Electric Corporation of Japan. In some applications, the robot arm 120 selects the wafer from a wafer cassette used to store and transport a group of wafers. The robot arm 120 operates under control of a control system which includes a software program controlling the processor 142.

The robot 104 is programmed with the location at which the wafer 116 is to be placed on the ESC 112 in future process cycles. The robot 104 will place the wafer 116 at the programmed location with extreme precision, a process referred to as handoff. The robot 104 will place the wafer 116 at what may be termed a nominal position or processing position on the ESC 112 for processing. The nominal position is defined, for example, by data stored in the memory 144 of the controller 104. The processor 142 controls movement of the robot arm 120 and controls the current position with the nominal position as maintained in the memory 144. When the current position matches the nominal position, the processor stops movement of the robot arm and the wafer 116 is placed on the ESC 112. The robot 104 will place the wafer at the nominal position within a tolerance. The tolerance is chosen based on a variety of factors. One factor is the yield reduction allowed by the tolerance chosen.

The robot's position is defined by two variables, reach or R and angle or theta or Th. If the reach is beyond a normal position, so that the robot is relatively extended, this is referred to as a deep reach. On the other hand, if the reach is less than the normal position so that the robot is relatively retracted, this is referred to as a short reach. In the same way, the angle of placement of the robot arm 120 is referred to as being right or left of normal.

Over time, the placement by the robot may drift or change so that the robot, when moving the wafer to the nominal position, actually places the wafer outside the placement tolerance. The result is misalignment. The misalignment may be in the form of reach misalignment, theta misalignment or a combination of the two. When this occurs, the yield may decline to an unacceptable point. At this point, the robot needs to be realigned.

Figure 2:
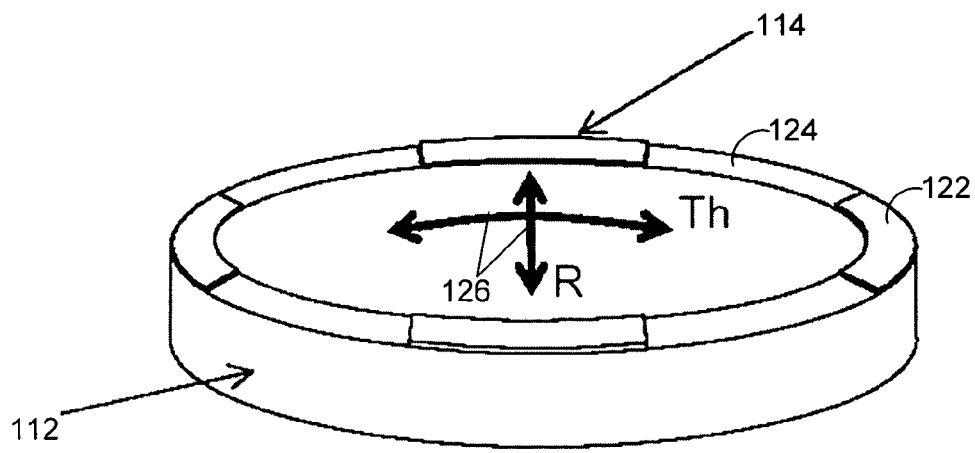
FIG. 2 is a view of an alignment jig positioned on an electrostatic chuck for use in the plasma etcher of FIG. 1.

FIG. 2 is an isometric view of the alignment jig 114 positioned on the electrostatic chuck 112. In a typical application, the alignment jig 114 is used during the regular maintenance and inspection (such as preventative maintenance) of the plasma etcher 102 to precisely align or re-align the robot arm 120 for subsequent operation. The alignment jig 114 is round to match the top of the ESC 112. The alignment jig 114 includes alignment lobes 122 which are upraised portions of the rim 124 of the jig 114 and provide improved visibility during the process of aligning the robot arm to the ESC 112. The jig 114 further includes alignment markers 126 to indicate correct orientation of the jig 114 to the R and theta movement directions of the robot arm. The robot arm can be manually aligned using visual inspection and the alignment jig 114.

Using the alignment jig 114 is a reliable and accurate way to realign the robot arm 120. In some applications, however, realignment under different circumstances may be required. For example, the alignment jig may only be used during a wet clean operation, when the semiconductor processing tool 100 is taken offline and given preventative maintenance. Generally, this occurs only infrequently, such as every two weeks. There are times when a real-time detection of misalignment is desired. Further, ever-smaller on-chip geometries require a quantitative alignment. The visual alignment process is qualitative. Still further, there are times when a rapid alignment verification is desired. The procedure using the alignment jig relies on a process engineer to inspect focus rings as verification which can be a slow process. Finally, safety suggests another method may produce desirable results. Process rings must be manually inspected. Inside the chamber these rings are exposed to HBr, NF3, SiF, and other toxic gases and handling the rings on a long term basis may not be beneficial.

Wafer proximity to the focus ring inside a chamber has a significant influence on oxide etch rate. This etch rate difference across wafer edge is used to determine whether wafer placement corrections are required. The present embodiments provide a method of aligning precisely to the points on the edge of the wafer.

The invention further provides a simple method of finding exact coordinates on the edge of the wafer 116 which correspond to the actual extreme coordinates of the non-excludable production die. The coordinates are used to measure the thickness of the oxide before processing. The measurement is made at multiple positions on the surface of the wafer 116. The wafer 116 is then etched or otherwise processed in the semiconductor processing tool 102. The thickness of the oxide is then re-measured, after etching of the oxide, at substantially the same multiple positions on the semiconductor surface. The difference between the measurement value and the re-measurement value is used to determine an etch rate. Etch rates are compared for the selected locations. The etch rates are then used to determine misalignments of the wafer.

Figure 3:
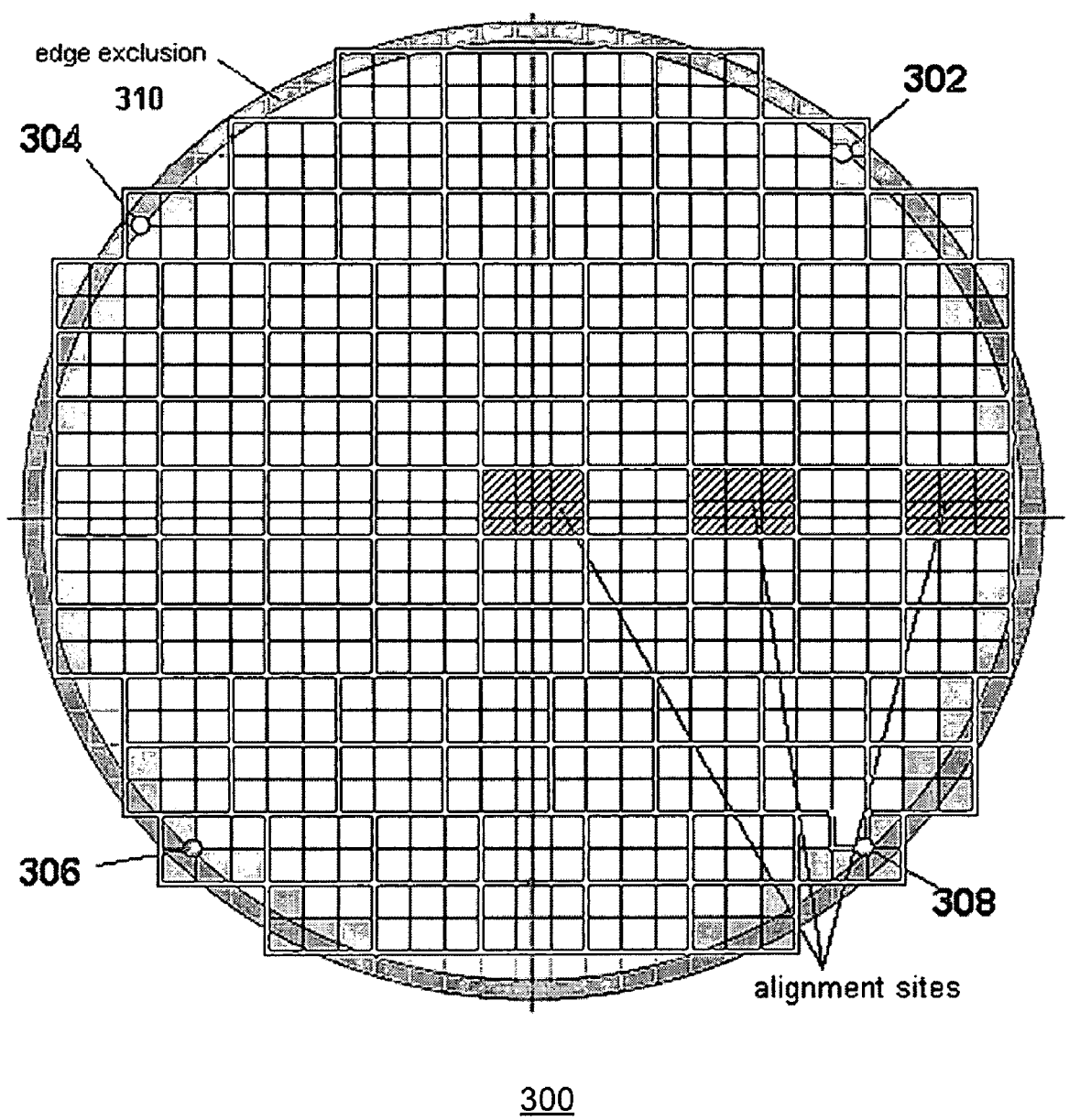
FIG. 3 is a view of a wafer placement monitor.

Previous attempts at an oxide etch rate measurement for this application failed because measurement coordinates could not be controlled precisely and hence no correlation to placement could be found. That is, to be accurate, oxide thickness in substantially the same locations must be measured and re-measured before and after processing. With no way to reliably find and re-find measurement coordinates, reliable etch rate measurements were impossible FIG. 3 shows a deep trench etch wafer placement monitor 300. The placement monitor 300 shows the outline of integrated circuit die sites on the surface of a wafer. For one exemplary embodiment, the placement monitor 300 shows four measurement sites 302, 304, 306, 308. Preferably, these are chosen at the edge of the yieldable edge exclusion zone. The exclusion zone is defined at the perimeter of the wafer where no functional dice may be produced, for example, because a complete die pattern does not fit on the edge of the wafer. In an embodiment suitable for wafers having a diameter of 100 mm, a distance of 98 mm is measured from the center of the wafer and measurement sites are chosen.

Figure 6:
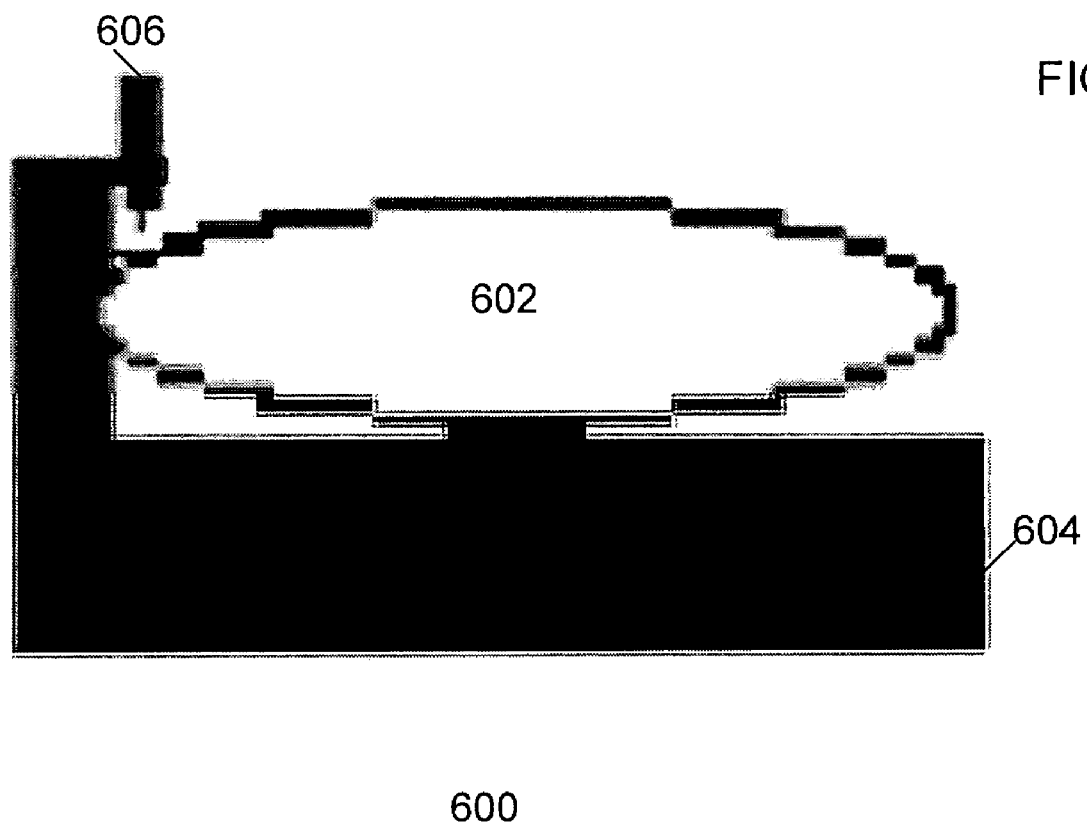
FIG. 6 shows a pre-aligner system.
Figure 7:
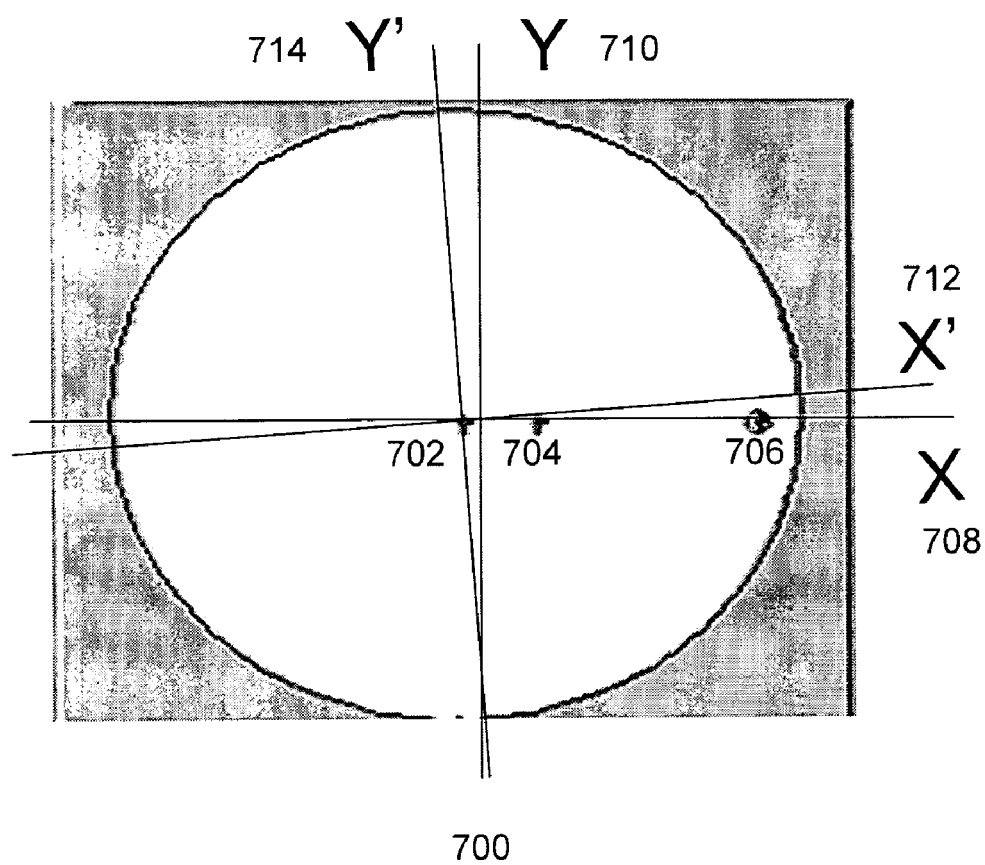
FIG. 7 shows a typical alignment scheme using a measuring tool.

Accurate measurement locations can be attained by using a patterned wafer and performing a multiple step alignment process on the measurement tool. Specifically, measurement tool and cassette wafer placement issues may be corrected using a pre-aligner system 600 shown in FIG. 6 where wafer 602 is rotated and an optical instrument 606 detects the edge of the wafer boundary and corrects for major errors in placement. On an unpatterned wafer, typically the site measurement accuracy can be controlled to within +/−0.5 mm because this is the only alignment that is possible. Using a patterned wafer, measurement position accuracy can be improved further by performing additional tests prior to measurement. Once on the measurement tool stage, a global alignment can be performed. FIG. 7 shows a typical alignment scheme. In this common arrangement 700, three points (702, 704, 706) can be used to correct for any deskew and linear placement offsets on the stage between the wafer coordinate system X/Y (708, 710) and stage X'/Y' coordinate system (712, 714). Such an alignment scheme typically guarantees measurement site accuracy to within +/−0.1 mm on modern measurement tools. After the global alignment a fine alignment can be performed in a similar manner.

When the measurement sites have been reliably determined, the thickness of the film on the surface of the wafer can be measured. Any suitable measurement technique or device may be used, such as an interferometer. Preferably, the measurement device should have an accuracy of less than 1% of the film measured for a film thicker than 100 nm.

Thickness of the film can be measured using any number of available techniques. For the application in question, a spectroreflectometer is the most economical solution. Using this method, a select area on the wafer is exposed using radiation that may extend from ultraviolet to infrared spectrum depending on measurement parameter setup. Film thickness is calculated based on the reflected spectrum (reflected intensity as a function of wavelength) compared to a known standard and based on several known parameters about the measurement locations such as the film being measured, its optical characteristics including the index of refraction and extinction coefficient across all wavelengths or radiation used in the calculation. Depending on the measurement the calculations can be extensive however commercial applications such as KLA-TENCOR 1080 film thickness measurement system, available from KLA Tencore Corp., San Jose, Calif., are more than adequate. Additional methods by which the thickness of the film in question can be calculated include ellipsometry where film properties are measured by examining the change in both intensity and phase component of the radiation as it strikes the wafer at a non-perpendicular angle. In order to resolve the complex calculations, wavelength of the incoming radiation or incidence angle are commonly varied to improve measurement accuracy. Furthermore, additional methods such as high resolution scanning electron microscopy, atomic force microscopy, profilometry, and hybrid acoustic methods may be used to measure the thickness of the film before and after etch for opaque films such as those employed in metal and conductor etch applications.

Figure 4:
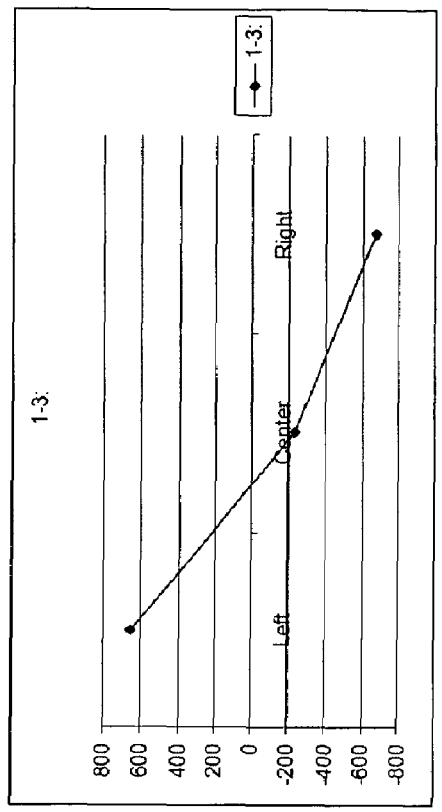
FIG. 4 is a view of a misalignment correction guide.
Figure 4:
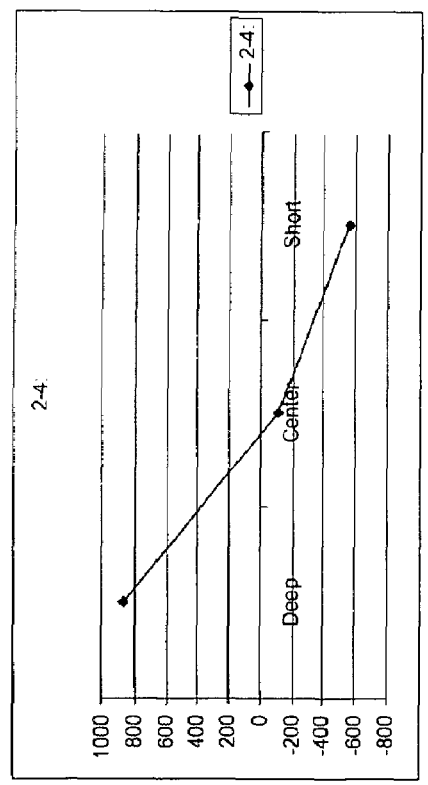

FIG. 4 shows plots 402, 404 illustrating adjustments to be made based on etch rate determined from the film thickness measurements made at the measurement sites illustrated in FIG. 3. The plots 402, 404 of FIG. 4 form a correction guide for correcting misalignment in a semiconductor processing tool. The plots 402, 404 together illustrate corrections for measurement sites which are diametrically opposed on the placement monitor 300 of FIG. 3.

Plot 402 shows placement correction for reach positioning of the robot arm 120. The difference between thickness measurements at points 308, 304 is used to determine an etch rate at two points on the opposite ends of the wafer. As mechanical placement of the wafer is intentionally varied in the direction connecting the two points, etch rate dramatically drops at one of the points and increases significantly at the other point. After mechanical placement is extended in the opposite direction alongside the same plane, the etch rate at the two points reverses. Once mechanical placement of the wafer is in best optical position, the etch rate uniformity of the equidistant points is the best. This same experiment was performed in the perpendicular direction as shown in plot 404. The etch rate difference between points 302 and 306 is the smallest once the wafer placement is in best position and increases proportionally to the amount of misplacement. Furthermore, the difference in the etch rate is again directionally related to the mechanical misplacement inside the chamber. In the statistical process control system, etch rate is monitored across all four point shown (302, 304, 306, 308). The difference between maximum and minimum etch rate is used to determine when a correction is necessary due to a drift that occurred as result of mechanical intervention or as a result of drift. Once the statistical process control system flags a particular process chamber as having an issue, maintenance personnel uses the difference in the etch rate the four points to determine what correction is necessary.

In place of the plots 402, 404, the information represented therein can be maintained in alternative ways. For example data corresponding to the plots 402, 404 can be stored in a look up table. An input to the look up table is the etch rate determined from the film thickness measurements. An output from the look up table is a correction to compensate or eliminate the reach misalignment and the theta misalignment.

Figure 5:
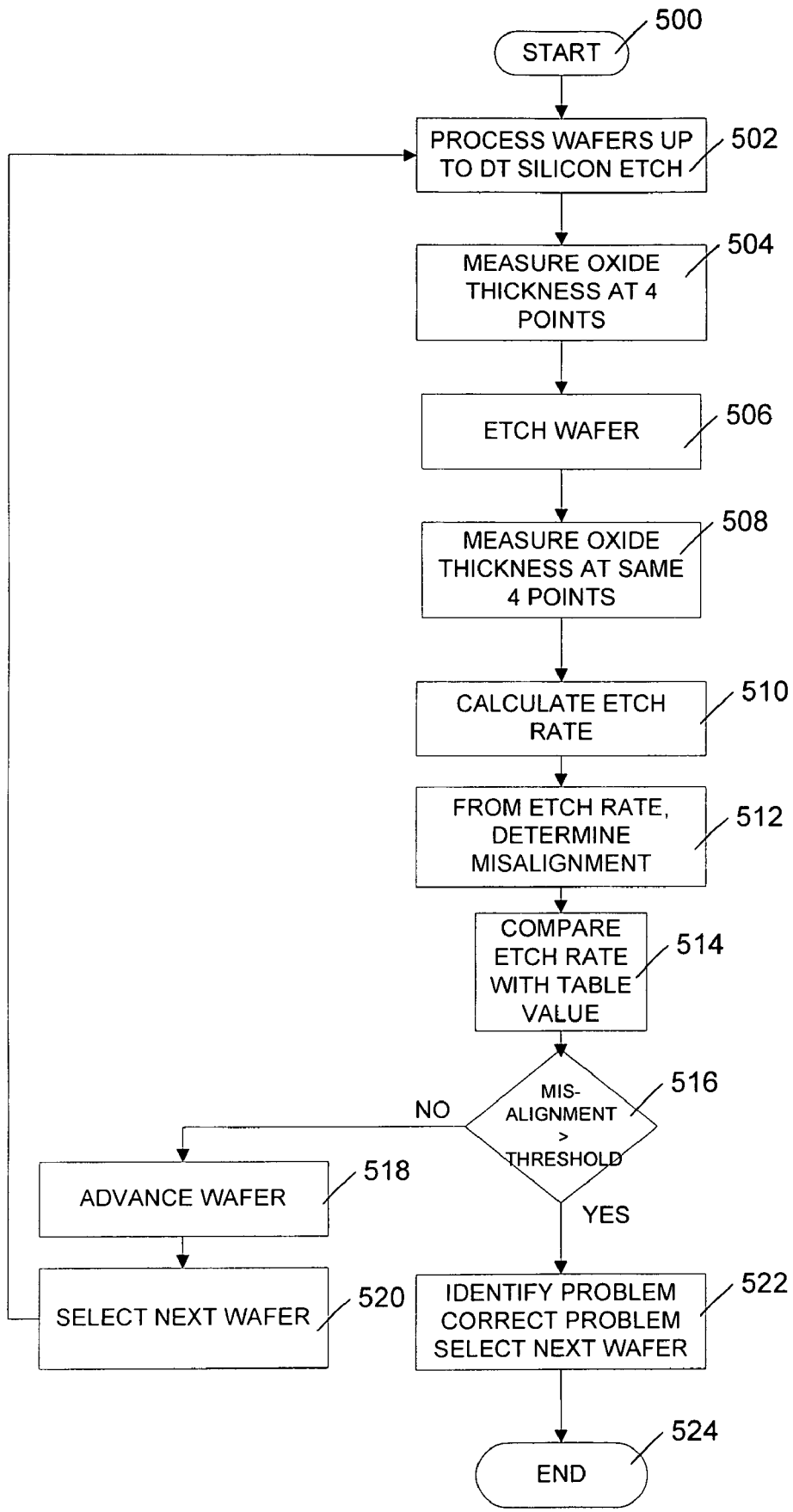
FIG. 5 is a flow diagram illustrating one embodiment of a method for monitoring precision of wafer placement alignment.

FIG. 5 is a flow diagram illustrating a method for monitoring precision of wafer alignment. The particular embodiment shown in FIG. 5 is useful for monitoring alignment in a plasma etcher based on the results produced by the plasma etcher. However, it will be recognized that the illustrated techniques can be extended to other processes as well. The method begins at block 500.

At block 502, a wafer is processed up to but not including the deep trench etch step. Conventional processing steps include photolithography to define the deep trenches and islands in between the trenches and other etches that form patterns with hard-mask for deep trench silicon etch. Other steps such as resist stripping may be performed as well.

At block 504, a film on the surface of the wafer is measured at a predetermined number of locations on the wafer surface. In the example of FIG. 3, a total of four locations are used which are located at four corner areas of the wafer. In other embodiments, more or fewer numbers of measurement sites may be used. Using four locations along perpendicular axes, located near the perimeter of the wafer as illustrated in FIG. 4, allows precision determination of misalignment. Also in other embodiments, a circular measurement pattern may be used to define polar coordinates for the measurements.

At block 506, the deep trench etch is performed. The etch process is performed under control of the plasma etcher 102 including its controller 108. The etch process operates to remove a predetermined amount of material from exposed portions of the wafer. Since plasma etching is otherwise highly uniform across the wafer, in general the predominant variation in the amount of film etched on the edge of the wafer during the process is due to misalignment of the wafer.

To determine this misalignment, following the etch step, at block 508, the oxide thickness is again measured at substantially the same measurement sites as were used for the measurement of block 504. At block 510, based on the two oxide thicknesses measured at block 504 and 508, an etch rate is determined for each of the measurement sites. Based on the etch rates for the measurement sites, any misalignment is identified, block 512. At block 514, the determined etch rate is compared with empirical data such as plots 402, 404 of FIG. 4 or a lookup table storing similar information.

Preferably, the misalignment is determined as a reach misalignment and a theta misalignment, so that each axis of motion of the robot arm may be corrected to ensure that when the next wafer is placed on the electrostatic chuck, the wafer will be placed accurately with no misalignment at the nominal position.

At block 516, the misalignment is compared with a threshold value. If less than the threshold value, the misalignment is still within tolerance and not causing a significant yield loss. If so, at block 518, the current wafer is advanced to the next phase of processing and a next wafer is selected at block 520. Control returns to block 502 as the next wafer is processed.

If the misalignment exceeded the threshold value at block 516, corrective action is taken at block 520. Generally, the problem causing the misalignment is identified, the problem is corrected and a next wafer is selected. More specifically, a position correction is determined and communicated to the controller 140 of the robot 104. The position correction is used to update the position information stored in the memory 144. The updated position information is subsequently used by the processor 142 when controlling the position of the robot arm 120.

From the foregoing, it can be seen that the present invention provides an improved system and method for monitoring and correcting precision alignment of a semiconductor processing tool. A quantitative measurement technique has been developed which permits accurate determination of wafer misalignment and correction thereof. The disclosed embodiments are unique because they can provide real-time detection when the robot starts drifting or a correlation to a maintenance activity that causes the problem. It is also unique in a way where it quantifies the extent of a wafer placement inaccuracy. This is an improvement over existing techniques which are qualitative and thus subjective, extremely labor intensive, and slow in detecting problems.

It is therefore intended that the foregoing detailed description be regarded as illustrative rather than limiting, and that it be understood that it is the following claims, including all equivalents, that are intended to define the spirit and scope of this invention.

The invention claimed is:

1. A method for monitoring wafer alignment in a semiconductor wafer processing flow, the method comprising:
    placing a semiconductor wafer in a semiconductor processing tool;
    measuring thickness of a film on the semiconductor wafer at multiple positions on the semiconductor wafer surface;
    processing the semiconductor wafer in the semiconductor processing tool;
    measuring the thickness of the film at substantially the same multiple positions on the semiconductor surface; and
    adjusting placement of subsequent semiconductor wafers based on the difference between the two measurements.

2. The method of claim 1 wherein processing the semiconductor wafer comprises etching a portion of the film.

3. The method of claim 2 further comprising:
    determining an etch rate of the film at each of the multiple positions on the semiconductor wafer surface; and
    based on the determined etch rates, adjusting placement of subsequent semiconductor wafers to minimize differences between the determined etch rates.

4. The method of claim 3 further comprising:
    based on the determined etch rates, looking up in a data reference a placement adjustment amount; and
    adjusting placement of the subsequent semiconductor wafers using the placement adjustment amount.

5. The method of claim 1 wherein processing the semiconductor wafer comprises polishing a portion of the film.

6. The method of claim 5 further comprising:
    determining a polish rate of the film at each of the multiple positions on the semiconductor wafer surface; and
    based on the determined polish rates, adjusting placement of subsequent semiconductor wafers to minimize differences between the determined polish rates.

7. The method of claim 6 further comprising:
    based on the determined polish rates, looking up in a data reference a placement adjustment amount; and
    adjusting placement of the subsequent semiconductor wafers using the placement adjustment amount.

8. The method of claim 1 wherein processing the semiconductor wafer comprises depositing or growing a portion of the film.

9. The method of claim 8 further comprising:
    determining a deposition or growth rate of the film at each of the multiple positions on the semiconductor wafer surface; and
    based on the determined deposition or growth rates, adjusting placement of subsequent semiconductor wafers to minimize differences between the determined deposition or growth rates.

10. The method of claim 9 farther comprising:
    based on the determined deposition or growth rates, looking up in a data reference a placement adjustment amount; and
    adjusting placement of the subsequent semiconductor wafers using the placement adjustment amount.

11. The method of claim 1 wherein processing the semiconductor wafer comprises spin coating a portion of the film.

12. The method of claim 11 farther comprising:
    determining a coat rate of the film at each of the multiple positions on the semiconductor wafer surface; and
    based on the determined coat rate, adjusting placement of subsequent semiconductor wafers to minimize differences between the determined deposition or growth rates.

13. The method of claim 12 farther comprising:
    based on the determined coat rates, looking up in a data reference a placement adjustment amount; and
    adjusting placement of the subsequent semiconductor wafers using the placement adjustment amount.

* * * * *